(12) United States Patent
Yamamoto

(10) Patent No.: US 6,470,479 B1
(45) Date of Patent: Oct. 22, 2002

(54) METHOD OF VERIFYING SEMICONDUCTOR INTEGRATED CIRCUIT RELIABILITY AND CELL LIBRARY DATABASE

(75) Inventor: Shigehisa Yamamoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/548,738

(22) Filed: Apr. 13, 2000

(30) Foreign Application Priority Data

Dec. 1, 1999 (JP) .......................................... 11-341802

(51) Int. Cl.$^7$ .............................................. G06F 17/50
(52) U.S. Cl. ................................... 716/4; 716/5; 716/6
(58) Field of Search ....................................... 716/1–21

(56) References Cited

FOREIGN PATENT DOCUMENTS

| JP | 10-104319 | 10/1999 |
|----|-----------|---------|
| JP | 11-274023 | 10/1999 |

OTHER PUBLICATIONS

Boon–Khin Liew, et al., "Circuit Reliability Simulator for Interconnect, Via, and Contact Electromigration", IEEE Transactions on Electron Devices, vol. 39, No. 11, Nov. 1992, pp. 2472–2479.

Chenming Hu, "IC Reliability Simulation", IEEE Journal of Solid–State Circuits, vol. 27, No. 3, Mar. 1992, pp. 241–245.

*Primary Examiner*—Matthew Smith
*Assistant Examiner*—Naum Levin
(74) *Attorney, Agent, or Firm*—Oblon, Spivak, McClelland, Maier & Neustadt, P.C.

(57) ABSTRACT

A method of verifying semiconductor integrated circuit reliability allows reliability verification of a large-scale semiconductor integrated circuit without any omission. Step S12 is to obtain a sum total (Cio) of inner-cell input/output load capacities in a selected cell on the basis of input and output load capacities registered in a cell library database (1A), and step S13 is to obtain wiring capacitance (Cic) between cells. In step S14, the sum total (Cio) of inner-cell input/output load capacities and the wiring capacitance (Cic) between cells are added to obtain output-terminal load capacity (COUT). On the basis of the output-terminal load capacity (COUT), a failure rate (FOUT) of an intercellular interconnect line is obtained in step S15, and a failure rate (Fcell) of inner-cell interconnect lines is obtained in step S16 from an equation registered in the cell library database (1A). Then, those failure rates (Fcell, FOUT) are added to obtain a total failure rate (Ftotal) in step S17.

14 Claims, 11 Drawing Sheets

METHOD OF VERIFYING SEMICONDUCTOR INTEGRATED CIRCUIT RELIABILITY AND CELL LIBRARY DATABASE

BACKGROUND OF THE INVENTION

1. Field of the Invention

The present invention relates to a method of verifying semiconductor integrated circuit reliability, especially, a method of verifying the reliability of interconnect lines in a semiconductor integrated circuit.

2. Description of the Background Art

One of the factors that impair the reliability of metallic interconnect lines in a semiconductor integrated circuit is electromigration. To ensure the reliability of a semiconductor integrated circuit, an electromigration failure rate must be suppressed below a predetermined level, and whether the failure rate is not more than a guaranteed failure rate must be verified at the design stage.

As a conventional way to detect metallic interconnect lines having a high electromigration failure rate in a semiconductor integrated circuit, there is a method using circuit simulations. For example, a circuit simulator called "SPICE (Simulation Program with Integrated Circuit Emphasis) is used to calculate current waveforms flowing in interconnect lines connected to each node.

Concurrently with this, layout data for the interconnect lines connected to each node is extracted from a circuit layout, and accelerated life evaluation data is obtained using an interconnection test structure. On the basis of the current waveforms from the SPICE simulator, the layout data, and the accelerated evaluation data, the failure rate of each metallic interconnect line due to electromigration is calculated. When the resultant failure rate is more than a reference value, the metallic interconnect line is extracted as having a high failure rate.

This method, however, takes much time to extract layout data for a complex interconnect line and is thus not applicable for a large-scale semiconductor integrated circuit. Further, large-scale circuits require enormous amounts of time for circuit simulations and a mass storage device to store waveform data for each node. This increases the difficulty of applying this method to a large-scale semiconductor integrated circuit.

In addition, input waveforms of circuit simulators such as SPICE cannot cover all circuits, which carries a risk that some non-operating circuits may be left unverified.

SUMMARY OF THE INVENTION

A first aspect of the present invention is directed to a method of verifying the reliability of a semiconductor integrated circuit using a cell library database. The semiconductor device includes a plurality of cells connected with each other by at least one intercellular interconnect line. The cell library database contains inner-cell input/output load capacity information including input load capacity and output load capacity of each of the plurality of cells, and information about a way to calculate a failure rate of an inner-cell interconnect line based on load capacity on an external terminal of each of the plurality of cells. The method comprises the steps of: (a) obtaining load capacity on the external terminal on the basis of the inner-cell input/output load capacity information; and (b) calculating a failure rate of an inner-cell interconnect line in a cell which has the external terminal, on the basis of the load capacity on the external terminal according to the way to calculate a failure rate, the steps (a) and (b) being performed for each of the plurality of cells.

According to a second aspect of the present invention, in the method of the first aspect, the step (a) includes the steps of: (a-1) obtaining a sum total of inner-cell input/output load capacities on the external terminal on the basis of the inner-cell input/output load capacity information; (a-2) obtaining wiring capacitance of an intercellular interconnect line which is connected to the external terminal, according to an equation of an intercellular interconnect line with the sum total of inner-cell input/output load capacities as a parameter; and (a-3) obtaining the load capacity on the external terminal by adding the wiring capacitance to the sum total of inner-cell input/output load capacities.

According to a third aspect of the present invention, in the method of the first aspect, the step (a) includes the steps of: (a-1) obtaining a sum total of inner-cell input/output load capacities on the external terminal on the basis of the inner-cell input/output load capacity information; (a-2) obtaining wiring capacitance of an intercellular interconnect line which is connected to the external terminal, on the basis of layout information about the intercellular interconnect line; and (a-3) obtaining the load capacity on the external terminal by adding the wiring capacitance to the sum total of inner-cell input/output load capacities.

According to a fourth aspect of the present invention, in the method of the third aspect, the intercellular interconnect line includes a plurality of intercellular interconnect elements which are connected with each other through via holes and which can be recognized from the layout information about the intercellular interconnect line. The method further comprises the steps of: (c) obtaining a failure rate of each intercellular interconnect element which is longer than a predetermined critical length out of the plurality of intercellular interconnect elements on the basis of the load capacity on the external terminal, and adding up the obtained failure rate of each intercellular interconnect element to obtain a failure rate of the intercellular interconnect line; and (d) obtaining a total failure rate by adding the failure rate of the intercellular interconnect line to the failure rate of the inner-cell interconnect line, the steps (c) and (d) being performed for each of the plurality of cells.

According to a fifth aspect of the present invention, the method of either of the first through third aspects further comprises the steps of: (c) obtaining a failure rate of the intercellular interconnect line on the basis of the load capacity on the external terminal; and (d) obtaining a total failure rate by adding the failure rate of the intercellular interconnect line to the failure rate of the inner-cell interconnect line, the steps (c) and (b) being performed for each of the plurality of cells.

According to a sixth aspect of the present invention, in the method of the fifth aspect, the cell library database further contains directional information indicating whether the external terminal of each of the plurality of cells is a bidirectional terminal that can be both charged and discharged or an unidirectional terminal that can be either charged or discharged, and the step (c) includes the steps of: (c-1) determining whether the external terminal is the bidirectional terminal or the unidirectional terminal on the basis of the directional information; (c-2) when the external terminal is the bidirectional terminal, calculating a failure rate of the intercellular interconnect line according to a first way; and (c-3) when the external terminal is the unidirectional terminal, calculating a failure rate of the intercellular interconnect line according to a second way different from the first way.

According to a seventh aspect of the present invention, the method of either of the first through sixth aspects further comprises the steps of: (e) after the step (a), calculating a mean current value flowing in the intercellular interconnect line on the basis of the load capacity on the external terminal and, when the mean current value is not more than a preset current value, forcefully skipping the calculation of a failure rate of a cell having the external terminal, the step (e) being performed for each of the plurality of cells.

According to an eighth aspect of the present invention, in the method of either of the first through seventh aspects, the cell library database further contains operating-ratio information indicating an operating ratio which is the number of operations of each of the plurality of cells during a predetermined period of time, and the step (b) includes the step of calculating a failure rate of the inner-cell interconnect line in consideration of the operating ratio according to the operating-ratio information.

According to a ninth aspect of the present invention, in the method of either of the fourth through seventh aspects, the cell library database further contains operating-ratio information indicating an operating ratio which is the number of operations of each of the plurality of cells during a predetermined period of time; the step (b) includes the step of calculating a failure rate of the inner-cell interconnect line in consideration of the operating ratio according to the operating-ratio information; and the step (d) includes the step of obtaining a failure rate of the intercellular interconnect line in consideration of the operating ratio according to the operating-ratio information.

According to a tenth aspect of the present invention, the method of either of the fourth through seventh aspects further comprises the step of: (f) when the total failure rate is not less than a reference failure rate, registering information about a cell concerned in a predetermined memory unit or displaying it to a predetermined output device, the step (f) being performed for each of the plurality of cells.

According to an eleventh aspect of the present invention, in the method of either of the first through tenth aspects, the failure rate includes an electromigration failure rate.

A twelfth aspect of the present invention is directed to a cell library database for reliability verification of a semiconductor integrated circuit which includes a plurality of cells connected with each other by at least one intercellular interconnect line. The cell library database contains: inner-cell input/output load capacity information including input load capacity and output load capacity of each of the plurality of cells; and information about a way to calculate a failure rate of an inner-cell interconnect line based on load capacity on an external terminal of each of the plurality of cells.

According to a thirteenth aspect of the present invention, the cell library database of the twelfth aspect further contains: directional information indicating whether the external terminal of each of the plurality of cells is a bidirectional terminal that can be both charged and discharged or a unidirectional terminal that can be either charged or discharged.

According to a fourteenth aspect of the present invention, the cell library database of either of the twelfth and thirteenth aspects further contains: operating-ratio information indicating an operating ratio which is the number of operations of each of the plurality of cells during a predetermined period of time.

In the method of the first aspect, since the steps (a) and (b) are performed according to the inner-cell input/output load capacity information and the way to calculate the failure rate of an inner-cell interconnect line based on the load capacity on the external terminal, both of which are obtained from the cell library database, the failure rate of an inner-cell interconnect line in each of the plurality of cells can be calculated without the use of layout information about the inner-cell interconnect line. This increases processing speed, thereby allowing reliability verification of a large-scale semiconductor integrated circuit. In addition, the execution of the steps (a) and (b) for each of the plurality of cells enables verification without any omission.

In the method of the second aspect, highly accurate load capacity is obtained by adding the wiring capacitance to the sum total of inner-cell input/output load capacities in the step (a-3). This improves the accuracy of the failure rate of an inner-cell interconnect line.

In addition, the use of the equation of an intercellular interconnect line with the sum total of inner-cell input/output load capacities as a parameter in the step (a-2) allows the wiring capacitance of an intercellular interconnect line connected to the external terminal to be obtained at high speed without the use of layout information about the intercellular interconnect line.

In the method of the third aspect, highly accurate load capacity is obtained by adding the wiring capacitance to the sum total of inner-cell input/output load capacities in the step (a-3). This improves the accuracy of the failure rate of an inner-cell interconnect line.

In addition, the use of the layout information about an intercellular interconnect line connected to the external terminal in the step (a-2) allows the wiring capacitance of the intercellular interconnect line to be obtained with high accuracy.

In the method of the fourth aspect, the total failure rate is obtained by adding the failure rate of an intercellular interconnect line to that of an inner-cell interconnect line through the execution of the steps (c) and (d). This improves the accuracy of the total failure rate.

Further, in the step (c), the failure rate of each intercellular interconnect element which is longer than a predetermined critical length is obtained and such failure rates are added up to obtain the failure rate of an intercellular interconnect line. Thus, if the critical length is adjusted so that the failure rate of each intercellular interconnect element which is shorter than the critical length becomes almost zero, it becomes possible to increase the operating speed and to obtain the failure rate of an intercellular interconnect line with high accuracy.

In the method of the fifth aspect, the total failure rate is obtained by adding the failure rate of an intercellular interconnect line to that of an inner-cell interconnect line through the execution of the steps (c) and (d). This allows the total failure rate to be in keeping with the real usage pattern.

In the method of the sixth aspect, the failure rate of an intercellular interconnect line is calculated in different ways depending on whether the external terminal is bidirectional or unidirectional according to the directional information. This improves the accuracy of the failure rate of an intercellular interconnect line.

In the method of the seventh aspect, when the mean current value is not more than a preset current value, the calculation of the failure rate of a cell having the external terminal is forcefully skipped in the step (e). Thus, if the preset current value is adjusted so that the total failure rate becomes almost zero when the mean current value is lower than the preset current value, high speed operation can be achieved without deterioration in the accuracy of verification.

In the method of the eighth aspect, the step (b) includes the step of calculating the failure rate of an inner-cell interconnect line in consideration of the operating ratio according to the operating-ratio information. This improves the accuracy of the failure rate of an inner-cell interconnect line.

In the method of the ninth aspect, the step (b) includes the step of calculating the failure rate of an inner-cell interconnect line in consideration of the operating ratio according to the operating-ratio information. This improves the accuracy of the failure rate of an inner-cell interconnect line.

Further, the step (d) includes the step of obtaining the failure rate of an intercellular interconnect line in consideration of the operating ratio according to the operating-ratio information. This improves the accuracy of the failure rate of an intercellular interconnect line.

In the method of the tenth aspect, when the total failure rate is not less than a reference failure rate, the information about the cell concerned is registered in a predetermined storage unit or displayed to a predetermined output device in the step (f). That is, information about the cell whose failure rate exceeds the reference failure rate can be recorded as a reliability verification result or recognized externally.

In the method of the eleventh aspect, the failure rate includes an electromigration failure rate. Thus, the electromigration failure rate of a large-scale semiconductor integrated circuit can be verified without any omission.

The cell library database of the twelfth aspect contains the inner-cell input/output load capacity information including input load capacity and output load capacity of each of the plurality of cells, and the information about the way to calculate the failure rate of an inner-cell interconnect line based on the load capacity on the external terminal of each of the plurality of cells. The use of this cell library database in the method of the first aspect allows reliability verification of a large-scale semiconductor integrated circuit without any omission.

The cell library database of the thirteenth aspect further contains the directional information indicating whether the external terminal of each of the plurality of cells is a bidirectional terminal that can be both charged and discharged or a unidirectional terminal that can be either charged or discharged. The use of this cell library database in the method of the sixth aspect allows the failure rate of an intercellular interconnect line to be obtained with high accuracy.

The cell library database of the fourteenth aspect further contains the operating-ratio information indicating the number of operations of each of the plurality of cells during a predetermined period of time. The use of this cell library database in the method of the eighth aspect allows the failure rate of an inner-cell interconnect line to be calculated in consideration of the operating ratio with higher accuracy.

Further, the use of this cell library database in the method of the ninth aspect allows the failure rates of an inner-cell interconnect line and an intercellular interconnect line to be calculated in consideration of the operating ratio with higher accuracy.

An object of the present invention is to provide a method of verifying semiconductor integrated circuit reliability, which allows reliability verification of a large-scale semiconductor integrated circuit without any omission.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
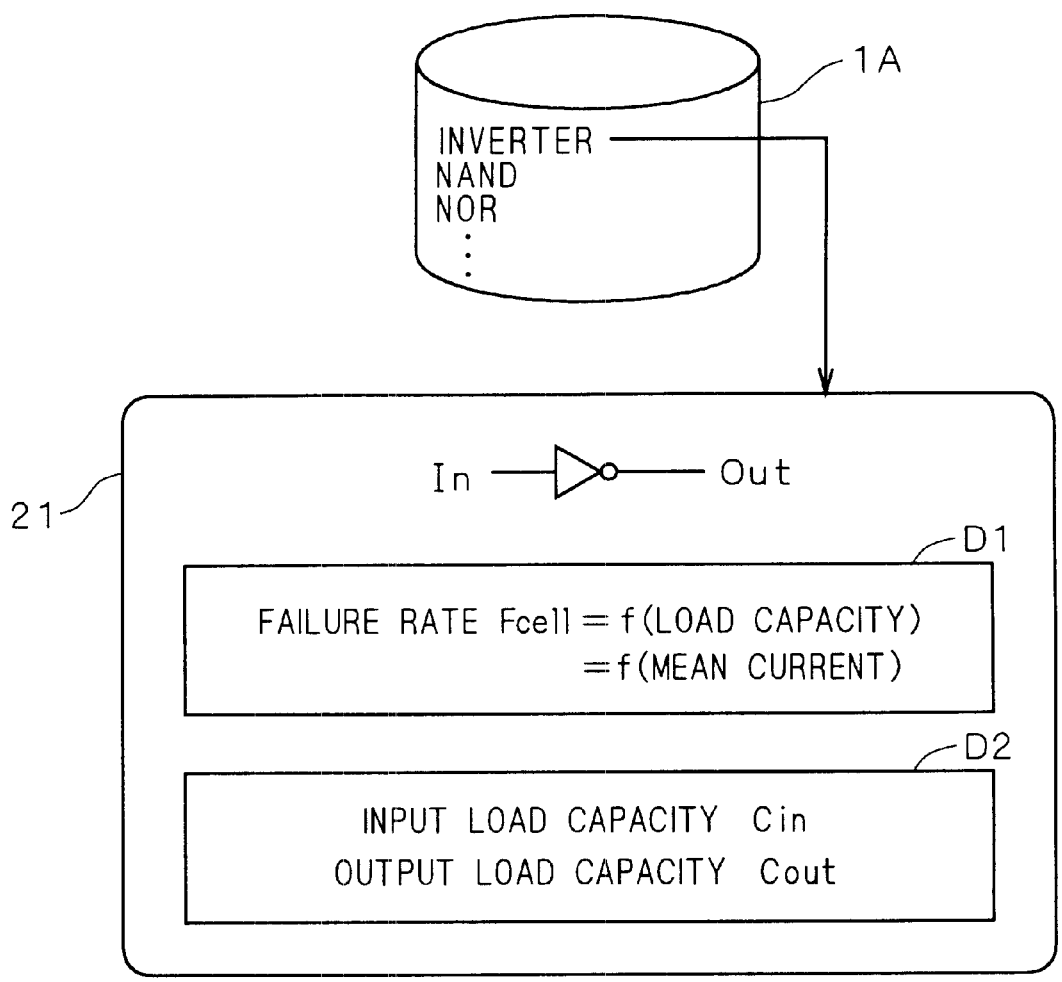
FIG. 1 shows an example of a design library used in a method of verifying semiconductor integrated circuit reliability according to a first preferred embodiment of the present invention.

FIG. 1 illustrates a cell library database structure used in a method of verifying semiconductor integrated circuit reliability according to a first preferred embodiment of the present invention. As shown, the first preferred embodiment uses a cell library database 1A for reliability verification. To differentiate between interconnect lines in cells (hereinafter referred to as "inner-cell interconnect lines") and interconnect lines between cells (hereinafter referred to as "intercellular interconnect lines") thereby to detect circuits (cells) having a high electromigration failure rate, the cell library database 1A contains information that permits the calculation of the electromigration failure rate of inner-cell interconnect lines in each cell based on load capacities connected to the cell, and information about wiring capacitance of each input/output terminal of a cell, which is included in the load capacities.

Data that permits the calculation of the electromigration failure rate includes data on an equation to be used in the calculation of the electromigration failure rate based on the load capacities connected to external terminals (input/output terminals) of each cell or on the mean current value calculated from the load capacities.

For instance, an inverter database 21 for storing data on inverter cells in the cell library database 1A stores, as well as circuit information, failure-rate data D1 including equation data for the calculation of an electromigration failure rate Fcell based on the load capacity or the (mean) current value, and input/output load capacity data D2 indicating input load capacity Cin and output load capacity Cout of an inverter.

Figure 2:
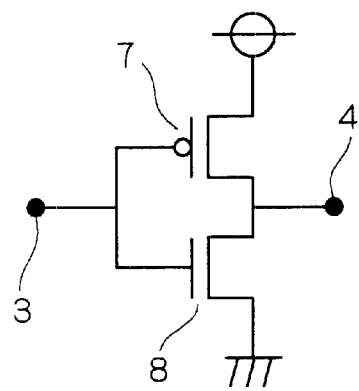
FIG. 2 is a circuit diagram showing an example of an inverter circuit.
Figure 3:
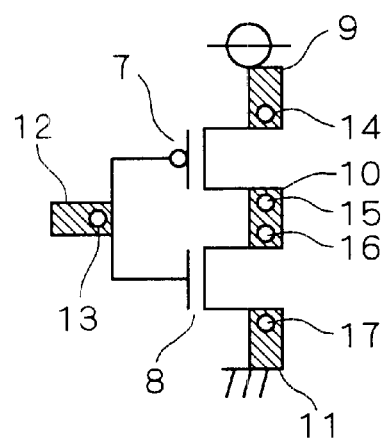
FIG. 3 shows an example of an inverter circuit with metallic interconnect lines.

FIG. 2 is a circuit diagram of a CMOS inverter, and FIG. 3 illustrates the inverter of FIG. 2 with metallic interconnections. As shown in FIG. 2, a PMOS transistor 7 and an NMOS transistor 8 are inserted in series between the power supply and the ground level. More specifically, the source of the PMOS transistor 7 is connected to the power supply, the drain of the PMOS transistor 7 to the drain of the NMOS transistor 8, and the source of the NMOS transistor 8 to the ground. The gates of the PMOS transistor 7 and the NMOS transistor 8 are connected in common to an input terminal 3, and their drains in common to an output terminal 4.

To meet the connections between the PMOS transistor 7 and the NMOS transistor 8 in FIG. 2, metallic interconnect lines 9 to 12 and contact holes 13 to 17 are used as shown in FIG. 3. More specifically, the metallic interconnect line 9 and the contact hole 14 connect the power supply and the source of the PMOS transistor 7; the metallic interconnect line 10 and the contact holes 15, 16 connect the drains of the PMOS transistor 7 and the NMOS transistor 8; the metallic interconnect line 11 and the contact hole 17 connect the source of the NMOS transistor 8 and the ground level. Further, the metallic interconnect line 12 and the contact hole 13 connect the input terminal 3 and the gates of both the PMOS transistor 7 and the NMOS transistor 8.

The failure rate Fcell of inner-cell interconnect lines in an inverter cell is the sum of the failure rates of the interconnect lines 9 to 12 and the contact holes 13 to 17. The failure rates of the metallic interconnect lines and the contact holes in each cell are previously registered as functions of the load capacity or the mean current value calculated from the load capacity. The failure rate, for example, can be obtained from a known equation based on failure distribution and the lengths of inner-cell interconnect lines which are obtained through accelerated evaluation of interconnection TEG, the number of contacts, the mean current value, working temperature, etc.

The use of the equation registered in the cell library database 1A of the first preferred embodiment allows the failure rate Fcell of inner-cell interconnect lines in each cell to be calculated from load capacities on the input/output terminals of that cell or from the mean current value. When the output terminal of a cell A is connected to the input terminal of a cell B by an intercellular interconnect line, for example, load capacity on the output terminal of the cell A is equal to the sum of the output load capacity Cout in the cell A, the input load capacity Cin in the cell B, and wiring capacitance between the cells A and B. When the input terminal of the cell A is connected to the output terminal of a cell C by an intercellular interconnect line, load capacity on the input terminal of the cell A is equal to the sum of the input load capacity Cin in the cell A, the output load capacity in the cell C, and wiring capacitance between the cells A and C.

The wiring capacitance between cells can be obtained by the extraction of layout information about intercellular interconnect lines. Another way to obtain the wiring capacitance between cells is to calculate a sum total Cio of inner-cell input/output load capacities from input load capacity Cin and output load capacity Cout of cells connected to the intercellular interconnect line. When the output terminal of a cell A is connected to the input terminal of a cell B by an intercellular interconnect line, for example, the sum total Cio of inner-cell input/output load capacities between the cells A and B is equal to the sum of the output load capacity Cout in the cell A and the input load capacity Cin in the cell B. From the equation based on this sum total Cio of inner-cell input/output load capacities, the wiring capacitance Cic between the cells can be obtained.

From the load capacity which is obtained by adding the wiring capacitance between cells and the sum total of inner-cell input/output load capacities, the failure rate of inner-cell interconnect lines in each cell can be calculated. This allows the speeding up of verification.

This method is applicable to various cells ranging from a microcell of an inverter, etc. to a macro cell of a memory, etc. Alternatively, the failure-rate data D1 for the equation to be used in the calculation of the electromigration failure rate of innercell interconnect lines may be stored not in the cell library but in another library provided specifically for reliability verification.

By using the cell library database 1A in the method of verifying semiconductor integrated circuit reliability according to the first preferred embodiment, the failure rate Fcell of inner-cell interconnect lines in each cell can be obtained without extracting layout information about inner-cell interconnect lines. This significantly facilitates the calculation of the electromigration failure rate of inner-cell interconnect lines, thereby allowing the speeding up of verification and expanding the applicability of this method to large-scale circuits. Further, all the cells can be verified without any omission since no input waveform is required as in SPICE simulations.

This method further increases the accuracy of reliability verification since the failure rate Fcell of inner-cell interconnect lines is calculated from the load capacity which is calculated in consideration of the sum total of inner-cell input/output load capacities.

Second Preferred Embodiment

Figure 4:
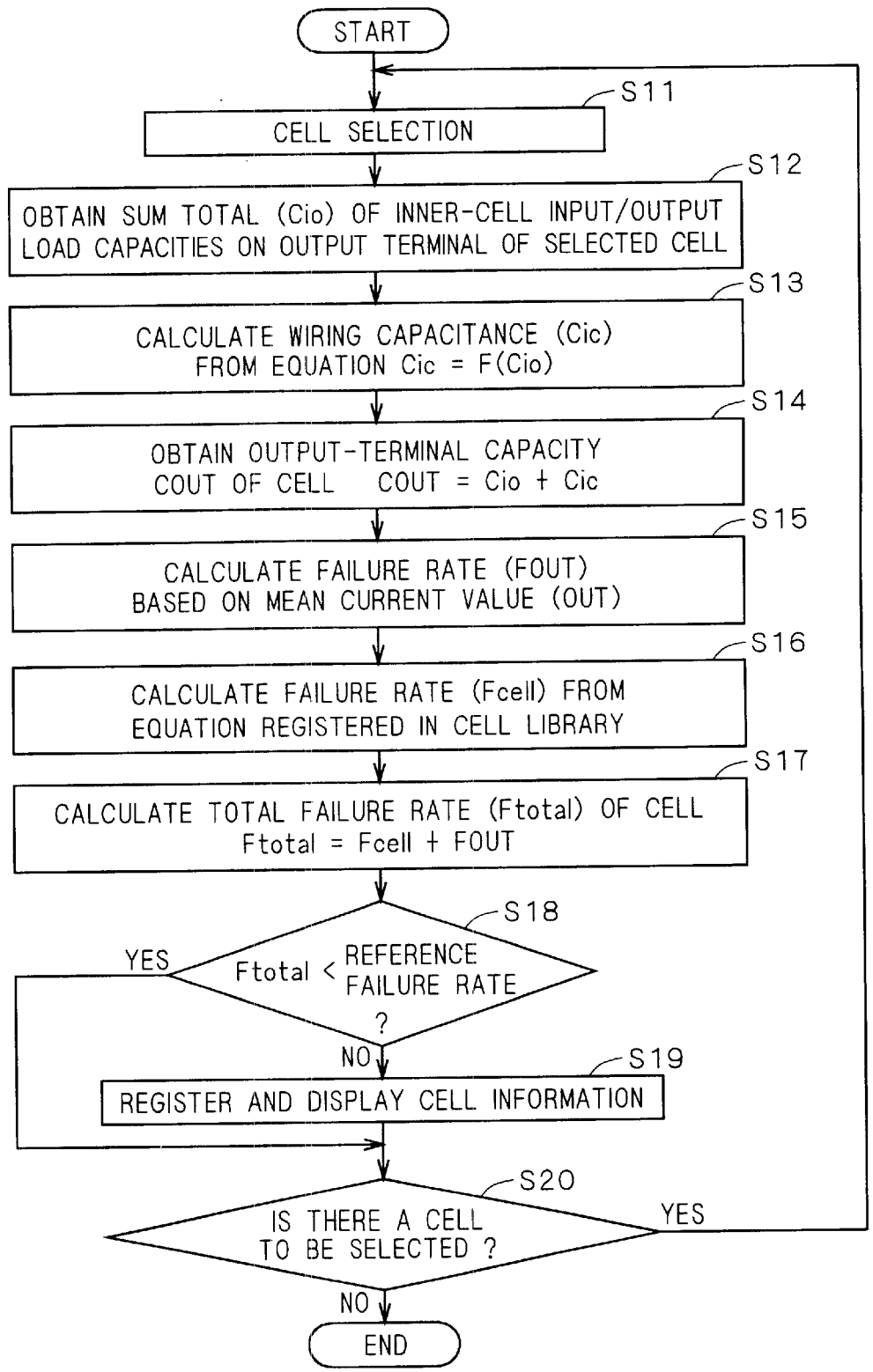
FIG. 4 is a flow chart of a method of verifying semiconductor integrated circuit reliability according to a second preferred embodiment of the present invention.

FIG. 4 is a flow chart of a method of verifying semiconductor integrated circuit reliability according to a second preferred embodiment of the present invention. This flow chart shows an algorithm for extracting cells having a high electromigration failure rate using the cell library database 1A of the first preferred embodiment. According to this algorithm, the wiring capacitance between cells is calculated as a function of the sum total of inner-cell input/output load capacities, and the failure rate of inner-cell interconnect lines is calculated at high speed without extracting even the layout of intercellular interconnect lines as well as that of inner-cell interconnect lines.

Step S11 is to select a cell sequentially from the cell library database 1A and logic circuit information about a semiconductor circuit (not shown in FIG. 1), for the calculation of the electromigration failure rate.

Step S12 is to obtain a sum total Cio of inner-cell input/output load capacities, e.g., input-terminal capacity of the next cell connected to the output terminal of a selected cell. When the output terminal of a cell A is connected to the input terminal of a cell B by an intercellular interconnect line, for example, the sum total Cio of inner-cell input/output load capacities on the output terminal of the cell A is equal to the sum of output load capacity Cout in the cell A and input load capacity Cin in the cell B.

Step S13 is to obtain the wiring capacitance Cic between cells from a relational expression f(Cio) based on the sum total Cio of inner-cell input/output load capacities. The relational expression f(Cio) is, for example, a function Cic=Cio/10 which is proportional to the sum total Cio of inner-cell input/output load capacities. This relational expression f(Cio) is obtained by finding, according to historical data for example, the characteristic that the length of the intercellular interconnect line increases in proportional to the sum total Cio of inner-cell input/output load capacities.

Instead of the above proportional function, an intercellular interconnect line may be determined by a virtual interconnection structure which is obtained from assumed information (e.g., interconnection layer, the width and length of interconnect lines, the numbers of contacts and vias) based on the sum total Cio of inner-cell input/output load capacities. This information about the interconnection layer means information about the materials of the interconnection layer, which generally constitutes a multilayer structure.

In step S14, the sum total Cio of inner-cell input/output load capacities obtained in step S12 and the wiring capacitance Cic between cells obtained in step S13 are added to obtain output-terminal load capacity COUT which is the load capacity on the output terminal of a cell.

Step S15 is to obtain the mean current value IOUT that can be estimated from the output-terminal load capacity COUT from the following equation (I) and the failure rate FOUT of the intercellular interconnect line on the basis of the mean current value IOUT.

$$IOUT=COUT \cdot (frequency) \cdot (supply\ voltage) \quad (I)$$

When the intercellular interconnect line is determined by a virtual interconnection structure in step S13, the failure rate FOUT of that intercellular interconnect line is obtained by calculating the failure rate of each component of the intercellular interconnect line (e.g., interconnect lines of different widths, partial interconnect lines classified by contacts, vias) on the basis of the mean current value IOUT and adding up those failure rates. Since the electromigration failure rate varies according to line width, with the assumption of a virtual interconnection structure, the failure rate FOUT of the intercellular interconnect line can also be calculated from an equation that gives consideration to line-width dependence or an equation that varies between different metallic interconnection layers.

On the basis of the output-terminal load capacity COUT which is the load capacity, the failure rate Fcell of inner-cell interconnect lines is calculated in step S16 from an equation previously registered in the cell library database 1A. The equation of the failure rate Fcell means an equation which has already been registered in the cell library as a function of the load capacity of the cell or of the mean current value calculated from the load capacity.

In step S17, the failure rate FOUT of the intercellular interconnect line obtained in step S15 and the failure rate Fcell of the inner-cell interconnect lines obtained in step S16 are added to calculate the total failure rate Ftotal of the cell. By adding up the failure rate FOUT of the intercellular interconnect line and the failure rate Fcell of the inner-cell interconnect lines, the total failure rate Ftotal has a higher degree of accuracy.

The total failure rate Ftotal calculated in step S17 is then compared with a predetermined reference failure rate in step S18. When the total failure rate Ftotal is less than the reference failure rate, the process skips step S19 and goes to step S20. Otherwise, the process goes to step S19.

In step S19, information about the cell having a high failure rate is registered for example in a high-failure-rate cell database previously prepared, and the same cell on a logic circuit or a layout pattern is displayed for example on a CRT to be recognized visually. That is, information on the cell having a failure rate larger than the reference failure rate can be recorded as a reliability verification result or recognized externally.

In step S20, the presence or absence of a cell to be selected is determined. In the absence of such a cell, the process is completed. With the presence of a cell to be selected, the process returns to step S11. Thereafter, the processing of the steps S11 to S20 is repeated until the absence of a cell to be selected is recognized.

Alternatively, it is also feasible to perform parallel processing of steps S12 to S19 for all selected cells by making the cell selection and the calculations (assumptions) of intercellular interconnect lines for the whole circuit by one operation.

The method of the second preferred embodiment eliminates the need for extracting layout information about inner-cell interconnect lines and intercellular interconnect lines, resulting in the speeding up of electromigration reliability verification.

In addition, the verification without the use of layout information at the logic circuit stage makes it possible to design a highly reliable semiconductor integrated circuit that is easy to improve after reliability verification. Further, all the cells can be verified without any omission since no input waveform is required as in SPICE simulations.

For convenience in description, FIG. 4 shows only an example of the calculation of the output terminal of a cell, but it goes without saying that a similar calculation should also be made for the input terminal. When the input terminal of a cell A is connected to the output terminal of a cell C by an intercellular interconnect line, for example, the sum total Cio of inner-cell input/output load capacities on the input terminal of the cell A is equal to the sum of input load capacity Cin in the cell A and output load capacity Cout in the cell C.

Third Preferred Embodiment

Figure 5:
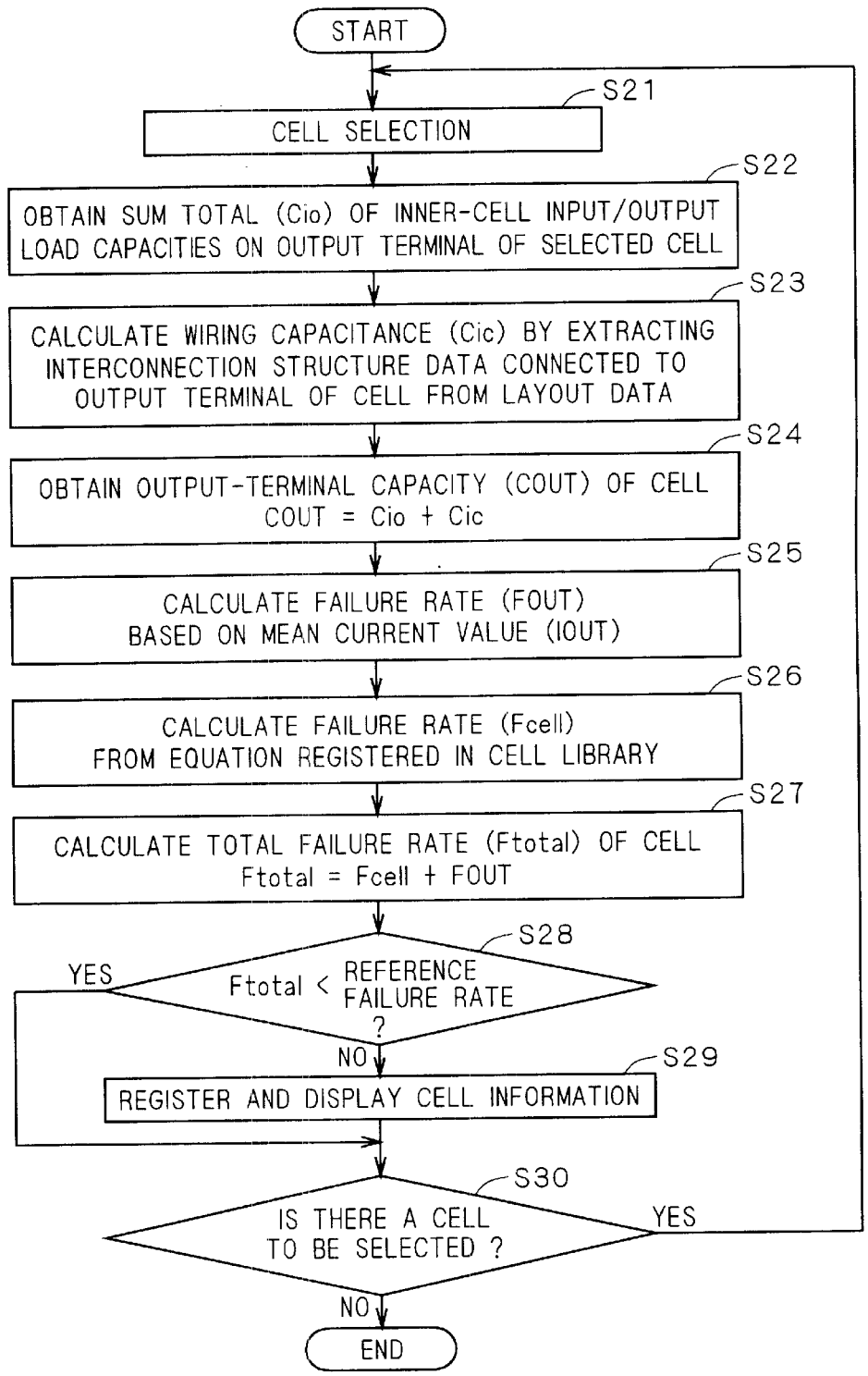
FIG. 5 is a flow chart of a method of verifying semiconductor integrated circuit reliability according to a third preferred embodiment of the present invention.

FIG. 5 is a flow chart of a method of verifying semiconductor integrated circuit reliability according to a third preferred embodiment of the present invention. This flow chart shows an algorithm for detecting cells and interconnect lines having a high electromigration failure rate using the cell library database 1A of the first preferred embodiment.

In steps S21 and S22, the cell selection and the calculation of the sum total Cio of inner-cell input/output load capacities are made as in steps S11 and S12 of the second preferred embodiment in FIG. 4.

Step S23 is to extract interconnection structure data on an intercellular interconnect line which is connected to the output terminal of a selected cell, from layout information about intercellular interconnect lines. The interconnection structure data includes data on a metallic interconnection layer constituting the intercellular interconnect line (e.g., a forming layer, width, length), data on a metallic interconnection structure consisting of a plurality of layers when one layer is connected to another through via and contact holes, and information containing the numbers of via and contact holes connecting the layers. On the basis of the interconnection structure data, the wiring capacitance Cic between cells can be estimated with accuracy.

Figure 6:
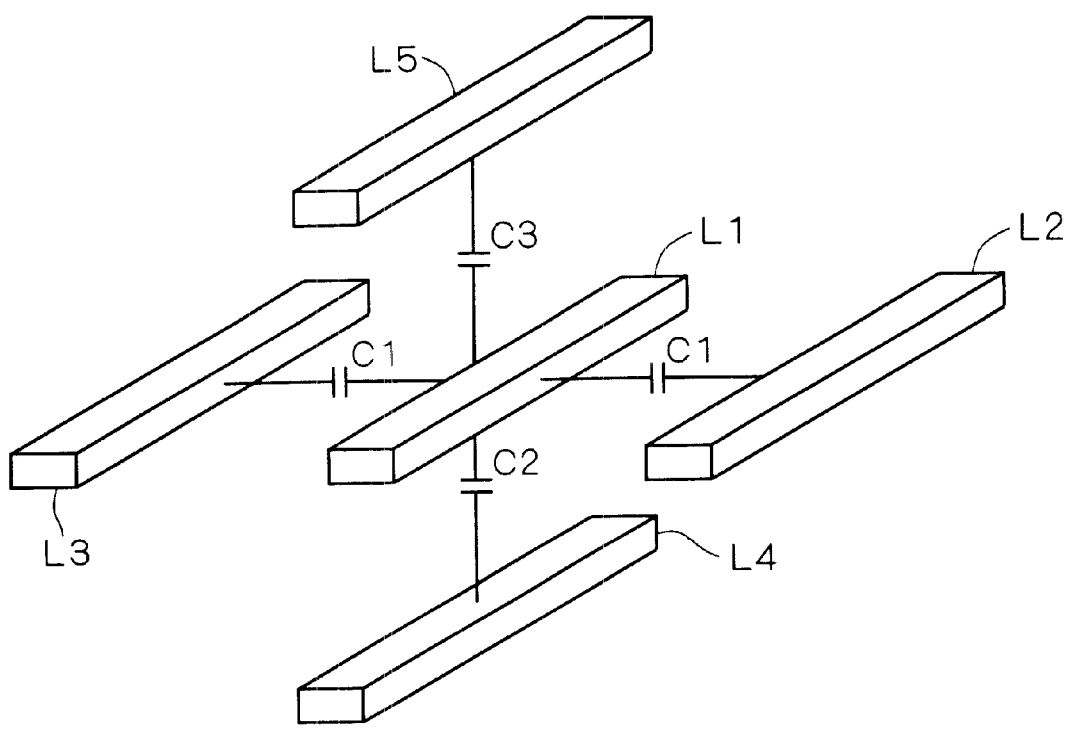
FIG. 6 shows an example of the calculation of wiring capacitance between cells based on interconnection structure data.

The interconnection structure data, for example, indicates that an intercellular interconnect line L1 is surrounded by interconnect lines L2 to L5 as shown in FIG. 6. In this case, the wiring capacitance Cic between cells can be estimated at 2C1+C2+C3, where C1 is the wiring capacitance between the line L1 and the lines L2, L3; C2 is the wiring capacitance between the lines L1 and L4; and C3 is the wiring capacitance between the lines L1 and L5.

The processing of steps S24 to S30 is performed in the same way as in steps S14 to S20 of the second preferred embodiment in FIG. 4.

As in the second preferred embodiment, it is also feasible in the third preferred embodiment to make the cell selection and the calculations of intercellular interconnect lines for the whole circuit by one operation.

The method of the third preferred embodiment eliminates the need for extracting layout information about inner-cell interconnect lines and can do only with the extraction of the interconnection structure data on intercellular interconnect lines. This allows the speeding up of electromigration reliability verification.

In addition, the wiring capacitance Cic between cells has a high degree of accuracy since the interconnection structure data obtained from the layout information about intercellular interconnect lines is used for the calculation. Further, all the cells can be verified without any omission since no input waveform is required as in SPICE simulations.

For convenience in description, FIG. 5 shows only an example of the calculation of the output terminal of a cell, but it goes without saying that a similar calculation should also be made for the input terminal as in the second preferred embodiment.

Fourth Preferred Embodiment

Figure 7:
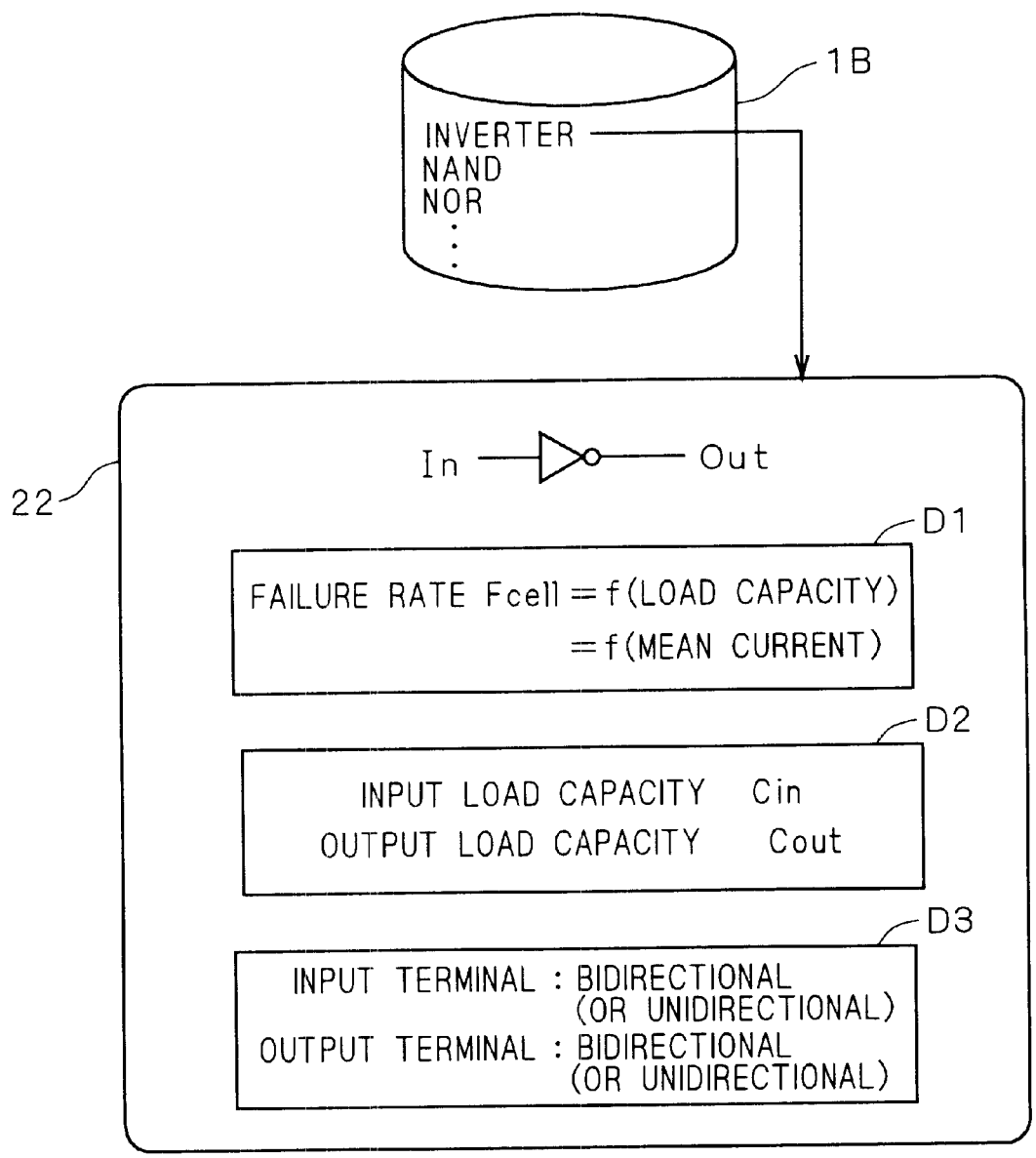
FIG. 7 shows an example of a design library used in a method of verifying semiconductor integrated circuit reliability according to a fourth preferred embodiment of the present invention.

FIG. 7 illustrates a cell library database structure used in a method of verifying semiconductor integrated circuit reliability according to a fourth preferred embodiment of the present invention. As shown, the fourth preferred embodiment uses a cell library database 1B for reliability verification. Besides the information in the cell library database 1A of the first preferred embodiment in FIG. 1, the cell library database 1B further contains information indicating whether current stress on the input/output terminal is "bidirectional" or "unidirectional".

The "bidirectional" indicates that the terminal concerned can be both charged and discharged, and the "unidirectional" indicates that the terminal concerned can be either charged or discharged. In an inverter database 22, for example, information about the directional properties (bidirectional or unidirectional) of both input and output terminals is registered as stress directional data D3.

In electromigration, lifetime with bidirectional stress is orders of magnitude better than that with unidirectional stress. For the calculation of the failure rate of innercell interconnect lines, equations for both the bidirectional stress and the unidirectional stress are previously registered. The failure rate can thus be calculated from different equations depending on the directional property (bidirectional or unidirectional) of the input/output terminal of a cell according to the bidirectional and unidirectional information in the cell library database 1B.

The use of the cell library database 1B in the method of the fourth preferred embodiment eliminates the need for extracting layout information about inner-cell interconnect lines. This allows the speeding up of verification without deterioration in accuracy and expands the applicability of this method to large-scale circuits. Further, all the cells can be verified without any omission since no input waveform is required as in SPICE simulations.

The calculation of the failure rate based on the directional properties of the input/output terminals of a cell further allows the failure rate to be in keeping with the real usage pattern. This improves, for example, allowable current in the interconnect lines, thereby increasing design flexibility. It is also possible to avoid the use of a relatively wide interconnect line since there is no harm in using a relatively narrow interconnect line for the bidirectional terminal. This method can thus contribute to a downsizing of semiconductor-integrated-circuit chips.

Fifth Preferred Embodiment

Figure 8:
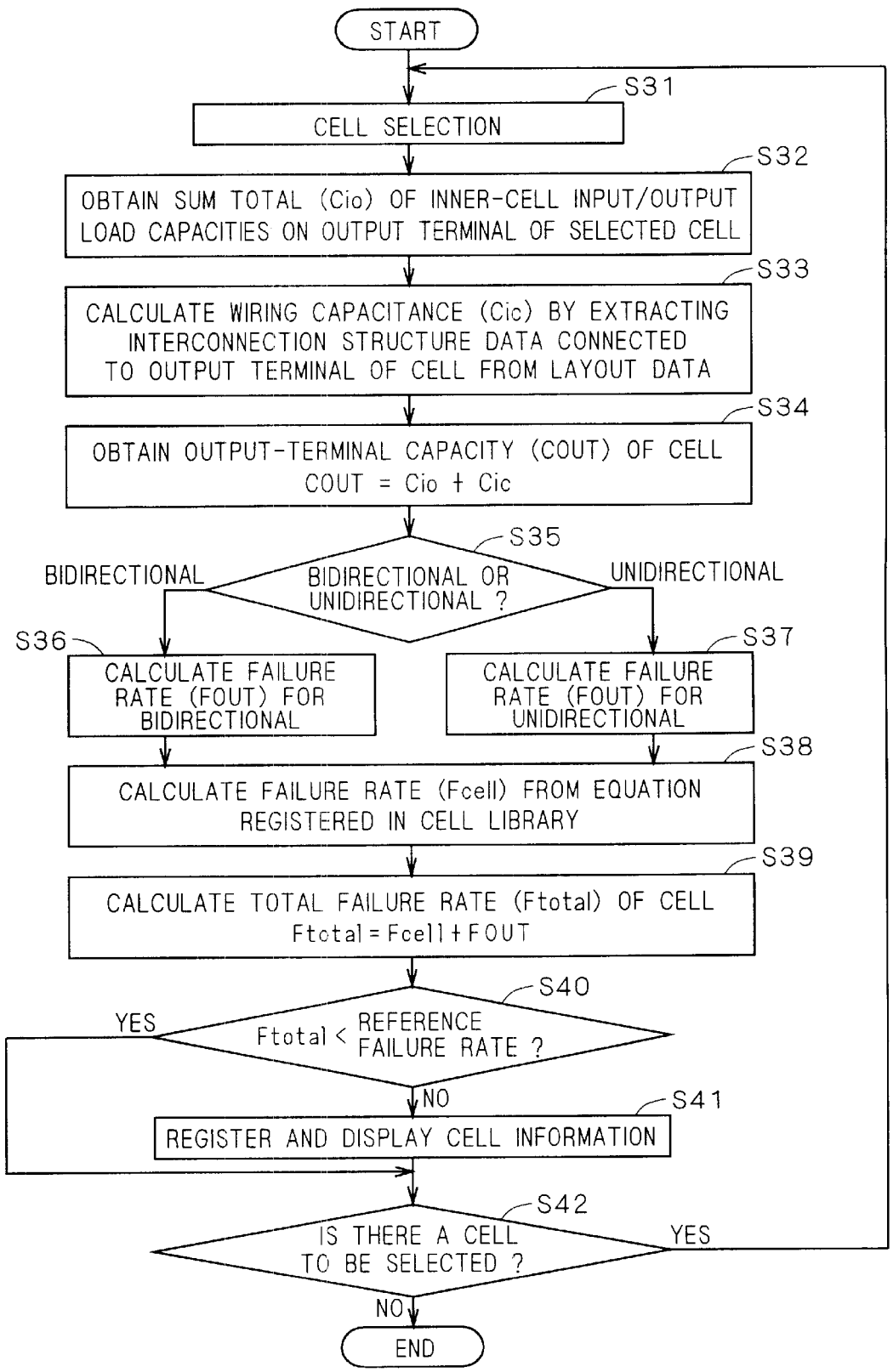
FIG. 8 is a flow chart of a method of verifying semiconductor integrated circuit reliability according to a fifth preferred embodiment of the present invention.

FIG. 8 is a flow chart of a method of verifying semiconductor integrated circuit reliability according to a fifth preferred embodiment of the present invention. This flow chart shows an algorithm using the cell library database 1B described in the fourth preferred embodiment. According to this algorithm, cells and interconnect lines having a high electromigration failure rate are detected in consideration of the directional properties of the input/output terminals of cells.

Referring to FIG. 8, in steps S31 to S34, the cell selection and the calculations of the sum total Cio of inner-cell input/output load capacities, the wiring capacitance Cic between cells, and the output-terminal load capacity COUT are made as in steps S21 to S24 of the third preferred embodiment in FIG. 5.

Then, the directional property of the output terminal of a selected cell is determined in step S35. The process goes to step S36 for the bidirectional terminal, and to step S37 for the unidirectional terminal.

Step S36 is to calculate the failure rate FOUT for the bidirectional terminal, and step S37 is to calculate the failure rate FOUT for the unidirectional terminal. After the calculation, the process goes to step S38. For example, "0" can be assumed as the failure rate FOUT for the bidirectional terminal, and the failure rate FOUT for the unidirectional terminal can be calculated by adding up the failure rate of each intercellular interconnect element using an equation based on the mean current value IOUT of the third preferred embodiment, for example.

The processing after step S37 (steps S38 to S42) is similar to that of steps S26 through S30 of the third preferred embodiment in FIG. 5, and thus the descriptions thereof are omitted.

The method of the fifth preferred embodiment eliminates the need for extracting the layer information about inner-cell interconnect lines and can make do only with the extraction of the interconnection structure data on intercellular interconnect lines. This allows the speeding up of electromigration reliability verification.

Also, the calculation of the wiring capacitance Cic between cells based on the interconnection structure data improves the accuracy of reliability verification. In this method, further, all the cells can be verified without any omission since no input waveform is required as in SPICE simulations.

In addition, the calculation in consideration of the directional property of the output terminal of a cell improves allowable current flowing in interconnect lines, thereby increasing design flexibility. It is also possible, as in the fourth preferred embodiment, to avoid the use of a relatively wide interconnect line. The method can thus contribute to a downsizing of chips.

For convenience in description, FIG. 8 only shows an example of the calculation of the output terminal of a cell but it goes without saying that a similar calculation should also be made for the input terminal as in the second preferred embodiment.

Sixth Preferred Embodiment

Figure 9:
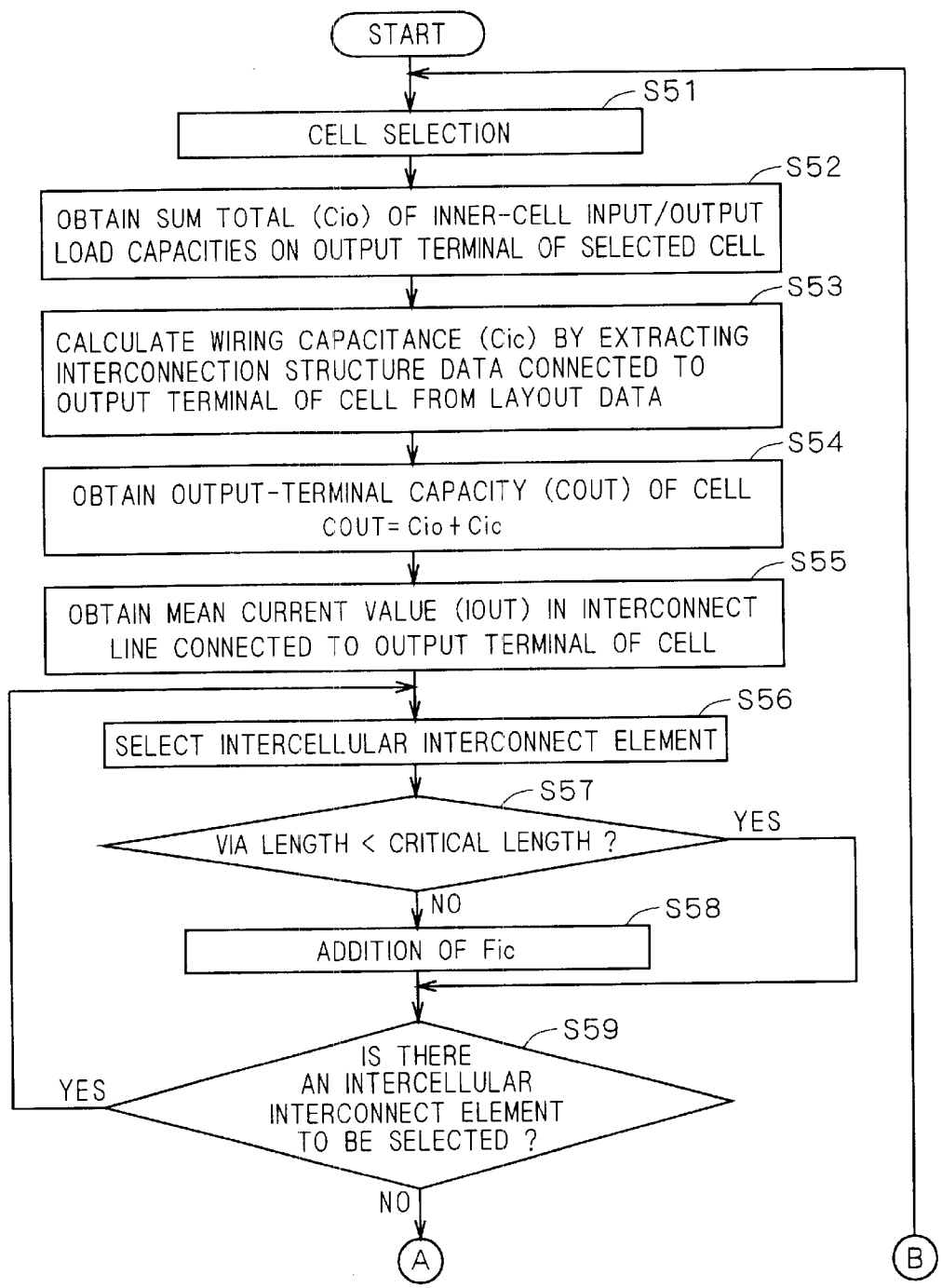
FIG. 9 is a flow chart showing the first half of a method of verifying semiconductor integrated circuit reliability according to a sixth preferred embodiment of the present invention.
Figure 10:
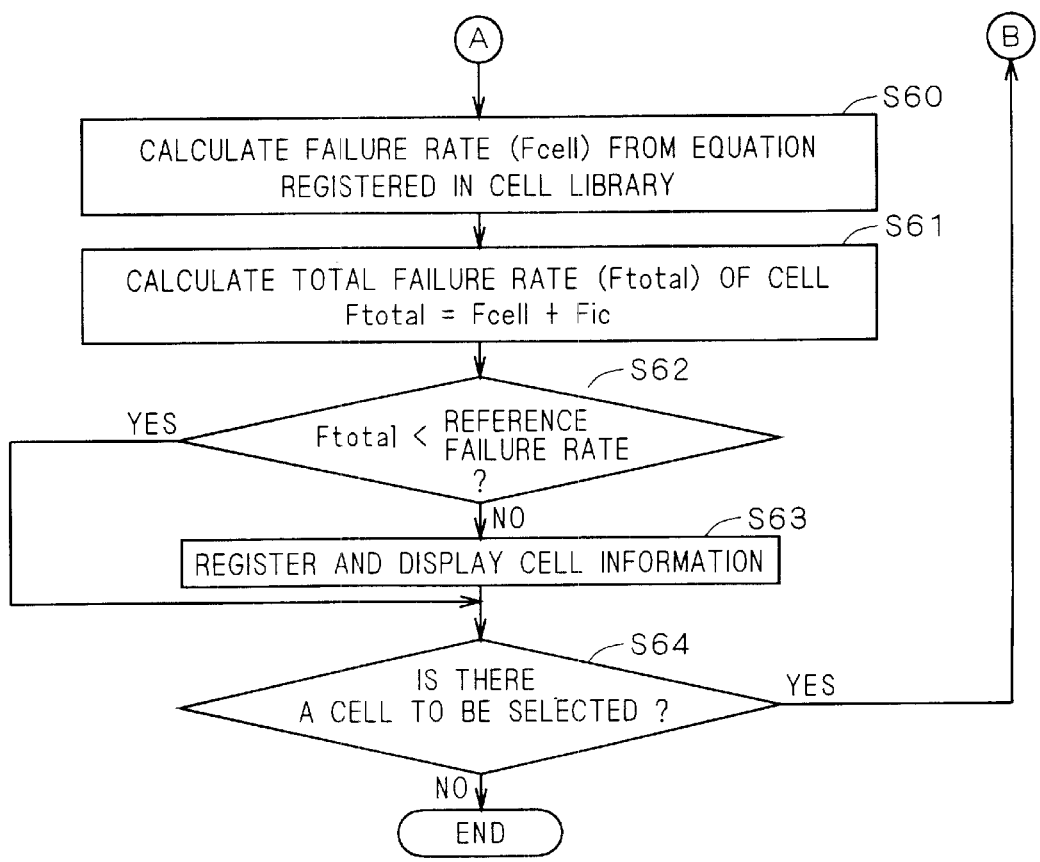
FIG. 10 is a flow chart showing the second half of the method of verifying semiconductor integrated circuit reliability according to the sixth preferred embodiment.

FIGS. 9 and 10 are flow charts of a method of verifying semiconductor integrated circuit reliability according to a sixth preferred embodiment of the present invention. This flow chart shows an algorithm using the cell library database 1B of the fourth preferred embodiment in FIG. 7. According to this algorithm, cells and interconnect lines having a high electromigration failure rate are detected in consideration of the directional properties of the input/output terminals.

Referring to the drawings, in steps S51 through S54, the cell selection and the calculations of the sum total Cio of inner-cell input/output load capacities, the wiring capacitance Cic between cells, and the output-terminal load capacity COUT are made as in steps S21 through S24 of the third preferred embodiment in FIG. 5.

Step S55 is to calculate the mean current value IOUT of an intercellular interconnect line connected to the output terminal of a selected cell.

In step S56, one of intercellular interconnect elements is selected according to the interconnection structure data.

Then, whether a via length of the selected intercellular interconnect element is shorter than a predetermined critical length CL is determined in step S57. For a shorter length, the process skips step S58 and goes to step S59. For a longer length, the process goes to step S58. Here, the via length means the line length between two via holes connecting interconnect lines in different layers, i.e., the line length of an intercellular interconnect element.

Step S58 is to obtain the failure rate Fic of the intercellular interconnect element concerned and add it to the failure rates Fic of other intercellular interconnect elements previously obtained. The process then goes to step S59.

In step S59, the presence or absence of an intercellular interconnect element to be selected is determined. With the presence of an interconnect element, the process returns to step S56. Otherwise, the process goes to step S60. Thereafter, the processing of steps S56 through S60 is repeated until the absence of an intercellular interconnect element is recognized in step S59.

Figure 11:
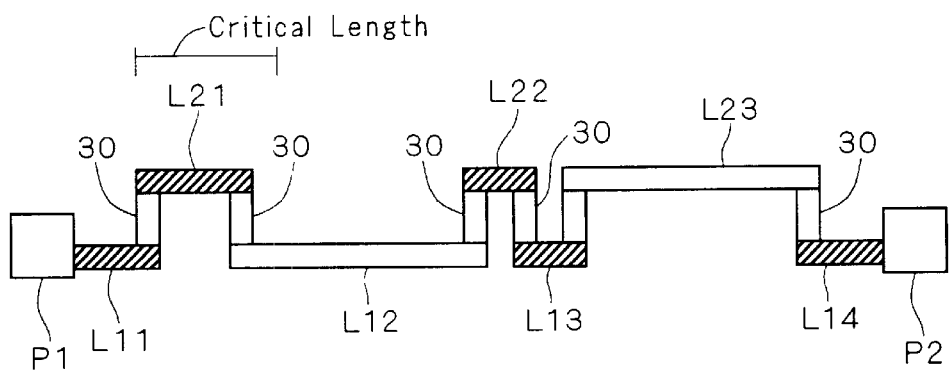
FIG. 11 is an explanatory drawing for the processing of the fifth preferred embodiment.

When the loop of steps S56 through S60 is broken, we can obtain a sum total of the failure rates Fic of the intercellular interconnect elements which have the via length greater than the critical length CL For example, consider the case where an intercellular interconnect line between terminals P1 and P2 is comprised of partial interconnect lines L11 to L14 in a first layer and partial interconnect lines L21 to L23 in a second layer as shown in FIG. 11 (each of the partial interconnect lines L11 to L14, L21 to L21 corresponds to an intercellular interconnect element). The partial interconnect line L11 is connected to the terminal P1 and the partial interconnect line L14 to the terminal P2, and via holes 30 provide connections between the partial interconnect lines L11 and L21, between the partial interconnect lines L21 and L12, between the partial interconnect lines L12 and L22, between the partial interconnect lines L22 and L13, between the partial interconnect lines L13 and L23, and between the partial interconnect lines L23 and L14.

In this case, the partial interconnect lines L11, L13, L14, L21, and L22 are shorter than the critical length CL, so "YES" is taken for the answer to the inquiry in step S57. Accordingly, the add operation of the failure rates in step S58 is not performed for those partial interconnect lines and is performed only for the partial interconnect lines L12 and L23.

Referring back to FIGS. 9 and 10, the processing after step S59 (steps S60 to S64) is similar to that of steps S26 through S30 of the third preferred embodiment in FIG. 5, and thus the descriptions thereof are omitted.

The method of the sixth preferred embodiment achieves the same effects as in the first preferred embodiment.

In addition, when the via length is not more than the critical length CL, no void would occur in electromigration and thus no failure would be caused. Accordingly, the add operation of the failure rates Fic in consideration of the via length allows the failure rate to be calculated at high speed with high accuracy.

For convenience in description, FIGS. 9 and 10 only show an example of the calculation of the output terminal of a cell, but it goes without saying that a similar calculation should also be made for the input terminal as in the second preferred embodiment.

Seventh Preferred Embodiment

Figure 12:
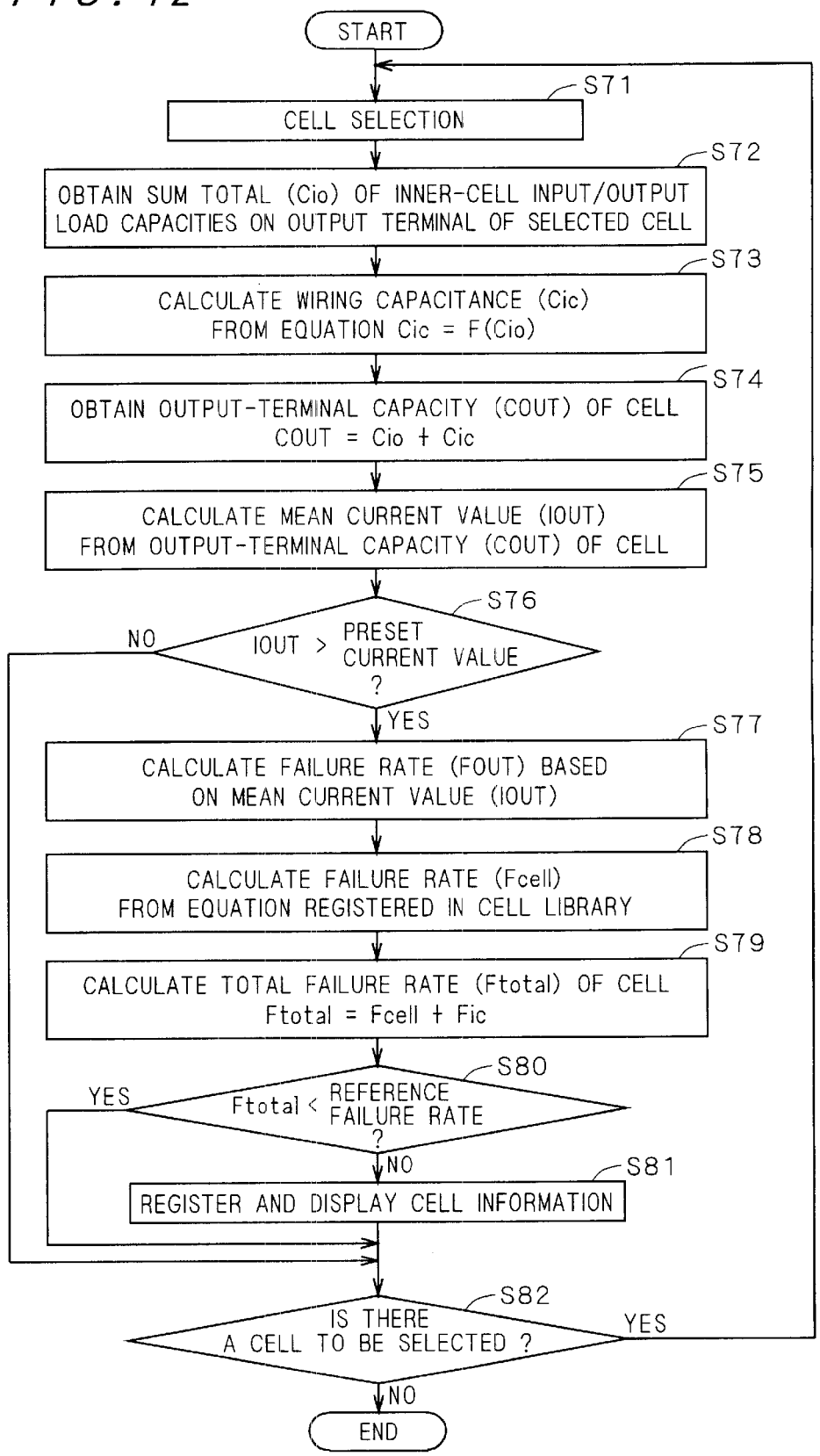
FIG. 12 is a flow chart of a method of verifying semiconductor integrated circuit reliability according to a seventh preferred embodiment of the present invention.

FIG. 12 is a flow chart of a method of verifying semiconductor integrated circuit reliability according to a seventh preferred embodiment of the present invention. This flow chart shows an algorithm using the cell library database 1B of the fourth preferred embodiment. According to this algorithm, cells and wires having a high electromigration failure rate are detected in consideration of the directional properties of the input/output terminals.

Referring to the drawing, in steps S71 through S74, the cell selection and the calculations of the sum total Cio of inner-cell input/output load capacities, the wiring capacitance Cic between cells, the output-terminal load capacity COUT are made as in steps S21 to S24 of the third preferred embodiment in FIG. 4.

Step S75 is to calculate the mean current value IOUT based on the output-terminal load capacity COUT.

When the mean current value IOUT exceeds a preset current value in step S76, the process goes to step S77. Otherwise, the process skips the processing of steps S77 through S81 and goes to step S82.

Step S77 is to calculate the failure rate FOUT based on the mean current value IOUT. The processing of steps S78 to S82 is similar to that of steps S16 to S20 of the third preferred embodiment in FIG. 4 and thus the descriptions thereof are omitted.

The method of the seventh preferred embodiment achieves the same effects as in the fifth preferred embodiment.

In addition, since the calculation of the total failure rate Ftotal is omitted when the mean current value IOUT is lower than the preset current value, high-speed processing becomes possible. If the preset current value is adjusted so that the total failure rate Ftotal becomes almost zero when the mean current value IOUT is lower than the preset current value, little deterioration in the accuracy of the total failure rate Ftotal will occur.

For convenience in description, FIG. 12 shows only an example of the calculation of the output terminal of a cell, but it goes without saying that a similar calculation should also be made for the input terminal as in the second preferred embodiment.

In the seventh preferred embodiment, the calculation of the total failure rate Ftotal is skipped when the mean current value IOUT is lower than the preset current value. Alternatively, the omission of this calculation may depend on the comparison result between the output-terminal load capacity and its reference value, for example. In this case, also, we can expect the same effect.

Eighth Preferred Embodiment

Figure 13:
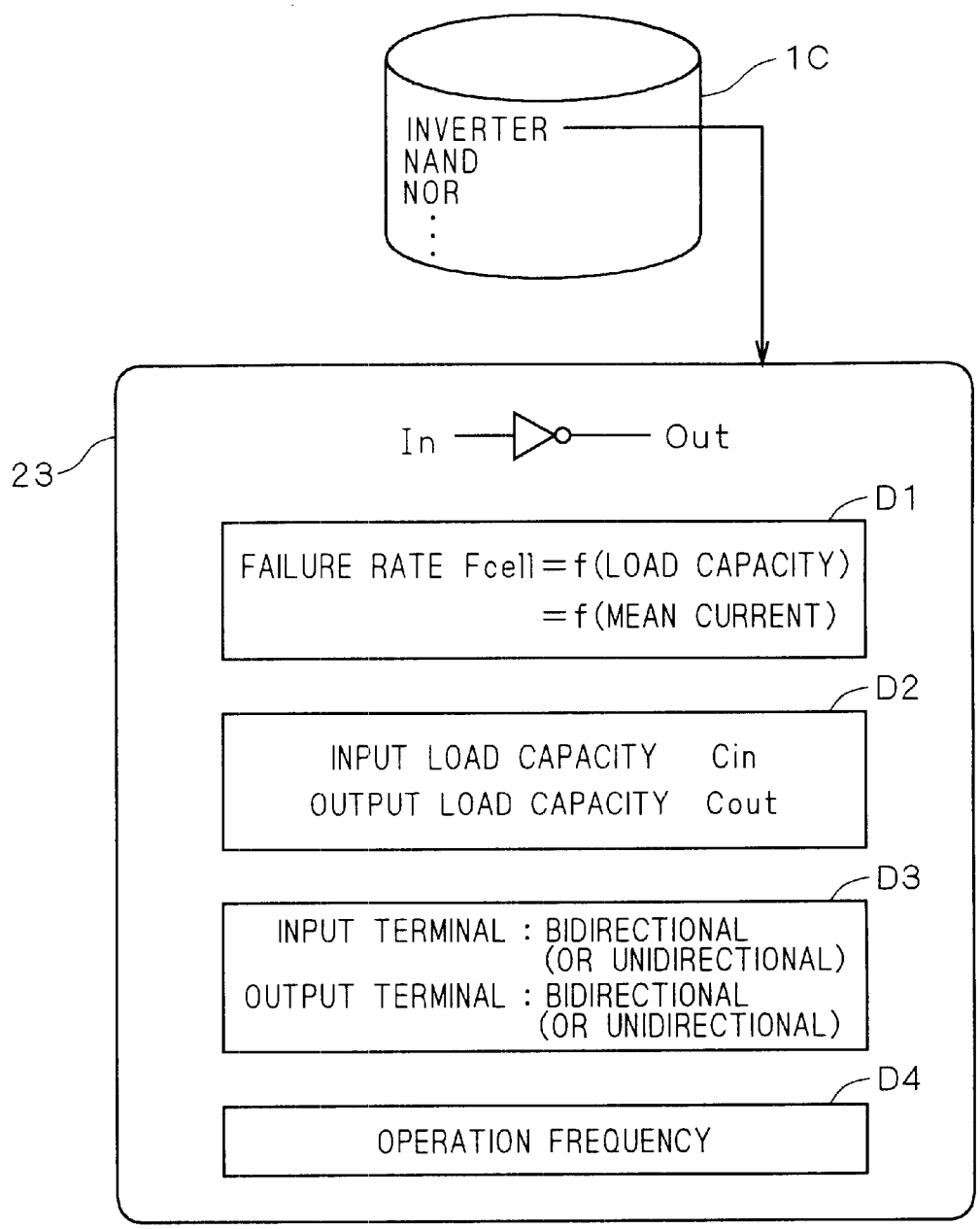
FIG. 13 shows an example of a design library used in a method of verifying semiconductor integrated circuit reliability according to an eighth preferred embodiment of the present invention.

FIG. 13 shows an example of a design library used in a method of verifying semiconductor integrated circuit reliability according to an eighth preferred embodiment of the present invention. As shown, this eighth preferred embodiment uses a cell library database 1C for reliability verification. Besides the information in the cell library database 1B of the fourth preferred embodiment in FIG. 7, the cell library database 1C further contains operating-ratio information indicating the number of operations of each cell during a predetermined period of time.

In an inverter database 23, for example, the operating-ratio information is registered as operating-ratio data D4.

The operating-ratio data D4 indicates how many times each cell operates during a predetermined period of time. The reason why the operating-ratio data D4 is registered is because the operating ratio of each cell varies in the real device instead of being uniform, e.g., once in each cycle.

On the basis of the operating-ratio information from the cell library database 1C, the failure rate of inner-cell interconnect lines and the failure rate of an intercellular interconnect line can be calculated in consideration of the operating ratio. In the flow chart of the second preferred embodiment in FIG. 4, for example, the calculation of the failure rate FOUT of an intercellular interconnect line in step S15 and the calculation of the failure rate Fcell of inner-cell interconnect lines in step S16 are performed in consideration of the operating ratio according to the operating-ratio information in the cell library database 1C. In the flow chart of the sixth preferred embodiment in FIGS. 9 and 10, the calculation of the failure rate Fic of each intercellular interconnect element in step S58 and the calculation of the failure rate Fcell in step S60 are performed in consideration of the operating ratio according to the operating-ratio information in the cell library database 1C.

In the calculation of the failure rate of an intercellular interconnect line, the mean current value in circuit operation which was obtained from the load capacity may be multiplied by the operating ratio, thereby to re-estimate the mean current value to be used for calculation.

The use of the cell library database 1C in the method of the eight preferred embodiment allows the failure rate to be calculated with high accuracy in consideration of the operating ratio.

While the invention has been shown and described in detail, the foregoing description is in all aspects illustrative and not restrictive. It is therefore understood that numerous modifications and variations can be devised without departing from the scope of the invention.

What is claimed is:

1. A method of verifying the reliability of a semiconductor integrated circuit using a cell library database, said semiconductor device including a plurality of cells connected with each other by at least one intercellular interconnect line, said cell library database containing inner-cell input/output load capacity information including input load capacity and output load capacity of each of said plurality of cells, and information about a way to calculate a failure rate of an inner-cell interconnect line based on load capacity on an external terminal of each of said plurality of cells, said method comprising the steps of:
 (a) obtaining load capacity on said external terminal on the basis of said inner-cell input/output load capacity information; and
 (b) calculating a failure rate of an inner-cell interconnect line in a cell which has said external terminal, on the basis of said load capacity on said external terminal according to said way to calculate a failure rate, said steps (a) and (b) being performed for each of said plurality of cells.

2. The method according to claim 1, wherein said step (a) includes the steps of:
 (a-1) obtaining a sum total of inner-cell input/output load capacities on said external terminal on the basis of said inner-cell input/output load capacity information;
 (a-2) obtaining wiring capacitance of an intercellular interconnect line which is connected to said external terminal, according to an equation of an intercellular interconnect line with said sum total of inner-cell input/output load capacities as a parameter; and
 (a-3) obtaining said load capacity on said external terminal by adding said wiring capacitance to said sum total of inner-cell input/output load capacities.

3. The method according to claim 1, wherein said step (a) includes the steps of:
 (a-1) obtaining a sum total of inner-cell input/output load capacities on said external terminal on the basis of said inner-cell input/output load capacity information;
 (a-2) obtaining wiring capacitance of an intercellular interconnect line which is connected to said external terminal, on the basis of layout information about said intercellular interconnect line; and
 (a-3) obtaining said load capacity on said external terminal by adding said wiring capacitance to said sum total of inner-cell input/output load capacities.

4. The method according to claim 3, wherein said intercellular interconnect line includes a plurality of intercellular interconnect elements which are connected with each other through via holes and which can be recognized from said layout information about said intercellular interconnect line, said method further comprising the steps of:
 (c) obtaining a failure rate of each intercellular interconnect element which is longer than a predetermined critical length out of said plurality of intercellular interconnect elements on the basis of said load capacity on said external terminal, and adding up obtained said failure rate of said each intercellular interconnect element to obtain a failure rate of said intercellular interconnect line; and (d) obtaining a total failure rate by adding said failure rate of said intercellular interconnect line to said failure rate of said inner-cell interconnect line, said steps (c) and (d) being performed for each of said plurality of cells.

5. The method according to claim 1, further comprising the steps of:
   (c) obtaining a failure rate of said intercellular interconnect line on the basis of said load capacity on said external terminal; and
   (d) obtaining a total failure rate by adding said failure rate of said intercellular interconnect line to said failure rate of said inner-cell interconnect line,
   said steps (c) and (b) being performed for each of said plurality of cells.

6. The method according to claim 5, wherein
   said cell library database further contains directional information indicating whether said external terminal of each of said plurality of cells is a bidirectional terminal that can be both charged and discharged or an unidirectional terminal that can be either charged or discharged, and
   said step (c) includes the steps of:
      (c-1) determining whether said external terminal is said bidirectional terminal or said unidirectional terminal on the basis of said directional information;
      (c-2) when said external terminal is said bidirectional terminal, calculating a failure rate of said intercellular interconnect line according to a first way; and
      (c-3) when said external terminal is said unidirectional terminal, calculating a failure rate of said intercellular interconnect line according to a second way different from said first way.

7. The method according to claim 1, further comprising the steps of:
   (e) after said step (a), calculating a mean current value flowing in said intercellular interconnect line on the basis of said load capacity on said external terminal and, when said mean current value is not more than a preset current value, forcefully skipping the calculation of a failure rate of a cell having said external terminal,
   said step (e) being performed for each of said plurality of cells.

8. The method according to claim 1, wherein
   said cell library database further contains operating-ratio information indicating an operating ratio which is the number of operations of each of said plurality of cells during a predetermined period of time, and
   said step (b) includes the step of calculating a failure rate of said inner-cell interconnect line in consideration of said operating ratio according to said operating-ratio information.

9. The method according to claim 5, wherein said cell library database further contains operating-ratio information indicating an operating ratio which is the number of operations of each of said plurality of cells during a predetermined period of time;
   said step (c) includes the step of calculating a failure rate of said inner-cell interconnect line in consideration of said operating ratio according to said operating-ratio information; and
   said step (d) includes the step of obtaining a failure rate of said intercellular interconnect line in consideration of said operating ratio according to said operating-ratio information.

10. The method according to claim 5, further comprising the step of:
    (f) when said total failure rate is not less than a reference failure rate, registering information about a cell concerned in a predetermined memory unit or displaying it to a predetermined output device,
    said step (f) being performed for each of said plurality of cells.

11. The method according to claim 1, wherein
    said failure rate includes an electromigration failure rate.

12. A cell library database for reliability verification of a semiconductor integrate circuit which includes a plurality of cells connected with each other by at least one intercellular interconnect line,
    said cell library database containing:
    inner-cell input/output load capacity information including input load capacity and output load capacity of each of said plurality of cells; and
    information about a way to calculate a failure rate of an inner-cell interconnect line based on load capacity on an external terminal of each of said plurality of cells.

13. The cell library database according to claim 12, further containing:
    directional information indicating whether said external terminal of each of said plurality of cells is a bidirectional terminal that can be both charged and discharged or a unidirectional terminal that can be either charged or discharged.

14. The cell library database according to claim 12, further containing:
    operating-ratio information indicating an operating ratio which is the number of operations of each of said plurality of cells during a predetermined period of time.

* * * * *